(12) United States Patent
Washio et al.

(10) Patent No.: US 10,804,622 B2
(45) Date of Patent: Oct. 13, 2020

(54) METHOD FOR MANUFACTURING ELECTRICAL CONNECTION ASSEMBLY

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Kazuhiro Washio, Mie (JP); Hiroki Hirai, Mie (JP); Yasuo Omori, Mie (JP); Toshio Shimizu, Mie (JP)

(73) Assignees: AutoNetworks Technologies, Ltd. (JP); Sumitomo Wiring Systems, Ltd. (JP); Sumitomo Electric Industries, Ltd. (JP)

( * ) Notice: Subject to any disclaimer, the term of this patent is extended or adjusted under 35 U.S.C. 154(b) by 0 days.

(21) Appl. No.: 16/316,258

(22) PCT Filed: Jun. 22, 2017

(86) PCT No.: PCT/JP2017/022977
§ 371 (c)(1),
(2) Date: Jan. 8, 2019

(87) PCT Pub. No.: WO2018/012238
PCT Pub. Date: Jan. 18, 2018

(65) Prior Publication Data
US 2019/0305439 A1    Oct. 3, 2019

(30) Foreign Application Priority Data
Jul. 12, 2016   (JP) .................................. 2016-137285

(51) Int. Cl.
*H01R 4/02*      (2006.01)
*H01R 13/658*   (2011.01)
(Continued)

(52) U.S. Cl.
CPC ............... *H01R 4/029* (2013.01); *H01R 4/02* (2013.01); *H01R 13/658* (2013.01); *H01R 43/00* (2013.01);
(Continued)

(58) Field of Classification Search
CPC .... H01R 13/658; H01R 3/36; H01R 43/0207; H01R 43/24; H01R 4/029
See application file for complete search history.

(56) References Cited

U.S. PATENT DOCUMENTS 5,947,770 A * 9/1999 Shinchi ................ H01R 13/504
                                                          156/73.1
6,474,998 B1   11/2002 Takeuchi
(Continued)

FOREIGN PATENT DOCUMENTS

JP    01-036987    3/1989
JP    2000-58170   2/2000
(Continued)

OTHER PUBLICATIONS

International Search Report dated Sep. 12, 2017.

*Primary Examiner* — Xuong M Chung Trans
(74) *Attorney, Agent, or Firm* — Gerald E. Hespos; Michael J. Porco; Matthew T. Hespos (57) ABSTRACT

A method is provided for manufacturing an electrical connection assembly includes preparing a connector (CN) in which each terminal (20) has a conductor connection surface (27a) exposed from an insulating housing (30), bringing parts of conductors and the conductor connection surfaces (27a) corresponding thereto into contact and connecting both while tension is applied to a wiring material (10). The method further includes fixing the wiring material (10) to the insulating housing (30) by bringing the wiring material (10) and the insulating housing (30) into contact with each other at the fixing positions separated in the longitudinal direction (Continued)

of the wiring material (10) from the parts to be connected and solidifying the fixing portions (34) of the insulating housing (30) after melting the fixing portions at the fixing positions.

8 Claims, 5 Drawing Sheets

(51) Int. Cl.
    *H01R 43/02*     (2006.01)
    *H01R 43/24*     (2006.01)
    *H05K 1/02*     (2006.01)
    *H05K 3/36*     (2006.01)
    *H01R 43/00*     (2006.01)

(52) U.S. Cl.
    CPC ......... *H01R 43/02* (2013.01); *H01R 43/0207* (2013.01); *H01R 43/24* (2013.01); *H05K 1/02* (2013.01); *H05K 3/36* (2013.01); *H05K 2201/20* (2013.01)

(56) References Cited

U.S. PATENT DOCUMENTS

| | | | | |
|---|---|---|---|---|
| 8,133,070 | B2* | 3/2012 | Hsueh | H01R 9/03 |
| | | | | 439/497 |
| 8,657,633 | B2* | 2/2014 | Shindo | H01R 13/405 |
| | | | | 439/660 |
| 9,276,330 | B2* | 3/2016 | Wu | H01R 12/775 |
| 2010/0130058 | A1* | 5/2010 | Hanyu | H01R 23/68 |
| | | | | 439/565 |

FOREIGN PATENT DOCUMENTS

| | | |
|---|---|---|
| JP | 2001-176603 | 6/2001 |
| JP | 3083026 | 1/2002 |
| JP | 2010-146939 | 7/2010 |
| JP | 3183252 | 5/2013 |

\* cited by examiner

METHOD FOR MANUFACTURING ELECTRICAL CONNECTION ASSEMBLY

BACKGROUND

Field of the Invention

The invention relates to an electrical connection assembly used in an automotive vehicle or the like and including a wiring material and a connector.

Related Art

A wiring material used in an automotive vehicle or the like has a flat material in which conductors are arrayed in a direction perpendicular to an axial direction of the conductors. The conductors are connected to terminals in a housing of a connector so that the conductors then can be connected to another circuit.

Conventionally, conductors arrayed as described above are connected directly to the terminals by soldering. This connection of the conductors to the terminals by soldering can simplify the structure of the terminals and make a connecting operation efficient.

Japanese Unexamined Patent Publication No. 2010-146939 discloses a method where wires are prepared to expose conductors by removing insulation coatings at ends of the wires in advance. The prepared wires are held in parts near tips of the conductors such that the tips of the conductors are aligned in a row. On the other hand, a connector to which the respective wires are to be connected includes terminals in the form of thin plates corresponding to the respective wires and a housing for holding the terminals. The housing has a flat terminal array surface and holds the terminals such that the terminals are exposed on the terminal array surface. Cream solder is set on surfaces of the terminals in advance, and the tips of the conductors and the surfaces of the terminals are soldered by pressing the cream solder against the surfaces of the terminals and heating the cream solder by a heater with the tips of the respective conductors of the wires positioned on the cream solder.

However, in an electrical connection assembly in which conductors on ends of wires are soldered directly to corresponding terminals as described above, tension generated in the wire directly acts on a soldered part and may cause a connection failure. A connector with a large-scale structure to hinder the action of tension enlarges the connector and drastically increases cost.

The invention aims to provide a method for manufacturing an electrical connection assembly with a wiring material including conductors and a connector. The method must protect connected parts of the wiring material and terminals included in the connector by a simple configuration. The invention also relates to a connector suitable for the method.

SUMMARY

A method is provided for manufacturing an electrical connection assembly with a wiring material including conductors and a connector including terminals respectively corresponding to the conductors and an insulating housing for collectively holding the terminals. The conductors are connected conductively to the respective terminals while being arranged at intervals in an array direction perpendicular to a longitudinal direction of the conductors. This method includes a connector preparing step of preparing a connector, in which each of the terminals has a conductor connection surface exposed outside the insulating housing from a surface of the insulating housing. The insulating housing holds the terminals such that the conductor connection surfaces are arranged in the array direction at the same intervals as the intervals of the conductors in the array direction. The method then includes a connecting step of electrically connecting parts to be connected set in the respective conductors and the conductor connection surfaces corresponding thereto while the conductors are held in a state arrayed at intervals from each other in the array direction. The method further includes a fixing step of fixing the wiring material to the insulating housing by bringing the wiring material and the insulating housing into contact with each other at a fixing position of the wiring material separated in a longitudinal direction of the wiring material from the parts to be connected and solidifying the insulating housing after melting the insulating housing at the fixing position.

The method also is directed to a connector suitable for the above-described method. This connector forms an electrical connection assembly by being connected to a wiring material including conductors. The connector has terminals respectively corresponding to the conductors and an insulating housing for collectively holding the terminals in array with the conductors being conductively connectable to the respective terminals while being arranged in an array direction perpendicular to a longitudinal direction of the conductors. Each of the terminals has a conductor connection surface exposed outside the insulating housing from a surface of the insulating housing and is connectable to a part to be connected set in each conductor. The insulating housing includes a housing body having a part for holding the terminals and a fixing portion made of synthetic resin having a lower melting point than a material constituting the housing body. The fixing portion is connected to the housing body to project from a surface of the housing body to be able to contact the wiring material at a fixing position separated in a longitudinal direction of the wiring material from the parts to be connected.

DETAILED DESCRIPTION

A preferred embodiment of the present invention is described with reference to the drawings.

FIGS. 1 to 6 show a manufacturing method according to this embodiment and an electrical connection assembly manufactured by this method. The electrical connection assembly includes wires 10 constituting a wiring material, and a connector CN for connecting the wires 10 to another connector.

Figure 4:
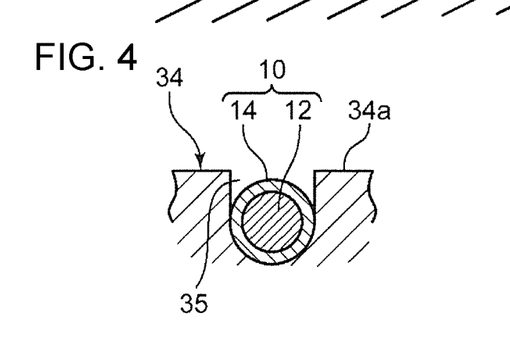
FIG. 4 is a front view partly in section showing a state where the wire is fit in a recess of a fixing portion of the connector.

Each of the wires 10 includes a conductor 12 and an insulation coating 14 for covering the conductor 12, as shown in FIG. 4. The wires 10 are connected to the connector CN while being arranged at intervals parallel to each other in an array direction perpendicular to a longitudinal direction thereof.

The connector CN includes terminals 20 respectively corresponding to the wires 10 and an insulating housing 30 for collectively holding the terminals 20.

Each of the terminals 20 according to this embodiment is a male terminal formed of a single long metal plate and includes a held portion 22, an electrical contact portion 23 and a wire connecting portion 24, as shown in FIG. 4. The held portion 22 is a part to be held in the insulating housing 30 as described later. The electrical contact portion 23 is a male contact portion in this embodiment and is shaped to fit into a female contact portion of a mating terminal. Specifically, the electrical contact portion 23 is shaped to extend straight from the held portion 22 in a first direction to be described later. The wire connecting portion 24 projects from the held portion 22 toward a side opposite to the electrical contact portion 23 and to be connected to one of the wires 10. The wire connecting portion 24 is described in detail later.

The insulating housing 30 is molded of an insulating material, such as synthetic resin, and integrally includes a terminal holding portion 32 and a receptacle 33.

The terminal holding portion 32 is a part for holding the held portions 22 of the terminals 20, and is in the form of a block in this embodiment. The terminal holding portion 32 collectively holds the terminals 20 arrayed in the array direction to enable the wires 10 arranged at intervals in the array direction to be connected conductively to the wire connecting portions 24 of the respective terminals 20.

Specifically, the terminal holding portion 32 holds the held portions 22 of the terminals 20 with the respective terminals 20 penetrating through the terminal holding portions 32 in a direction parallel to the first direction. The first direction is perpendicular to both a longitudinal direction of the wires 10 and the array direction with the wires 10 connected to the terminals 20, and is an upward direction in an orientation shown in FIGS. 5 and 6. That is, in this orientation, the held portions 22 are held in the terminal holding portion 32 in such a posture as to extend vertically inside the terminal holding portion 32. The held portions 22 may be fixed to the terminal holding portion 32 by being press-fit into through holes in the terminal holding portion 32 or by adhesive or the like.

The electrical contact portion 23 of each terminal 20 extends from the held portion 22 in a direction opposite to the first direction (down in FIG. 5) when the held portion 22 is held in the terminal holding portion 32, as described above, and is fit into the female contact portion of the mating terminal in this direction. The receptacle 33 is connected integrally to the terminal holding portion 32 and has a tubular shape to surround the electrical contact portions 23 on an outer side in a direction perpendicular to an axial direction (vertical direction in the orientation shown in FIG. 5) of the electrical contact portions 23.

Figure 6:
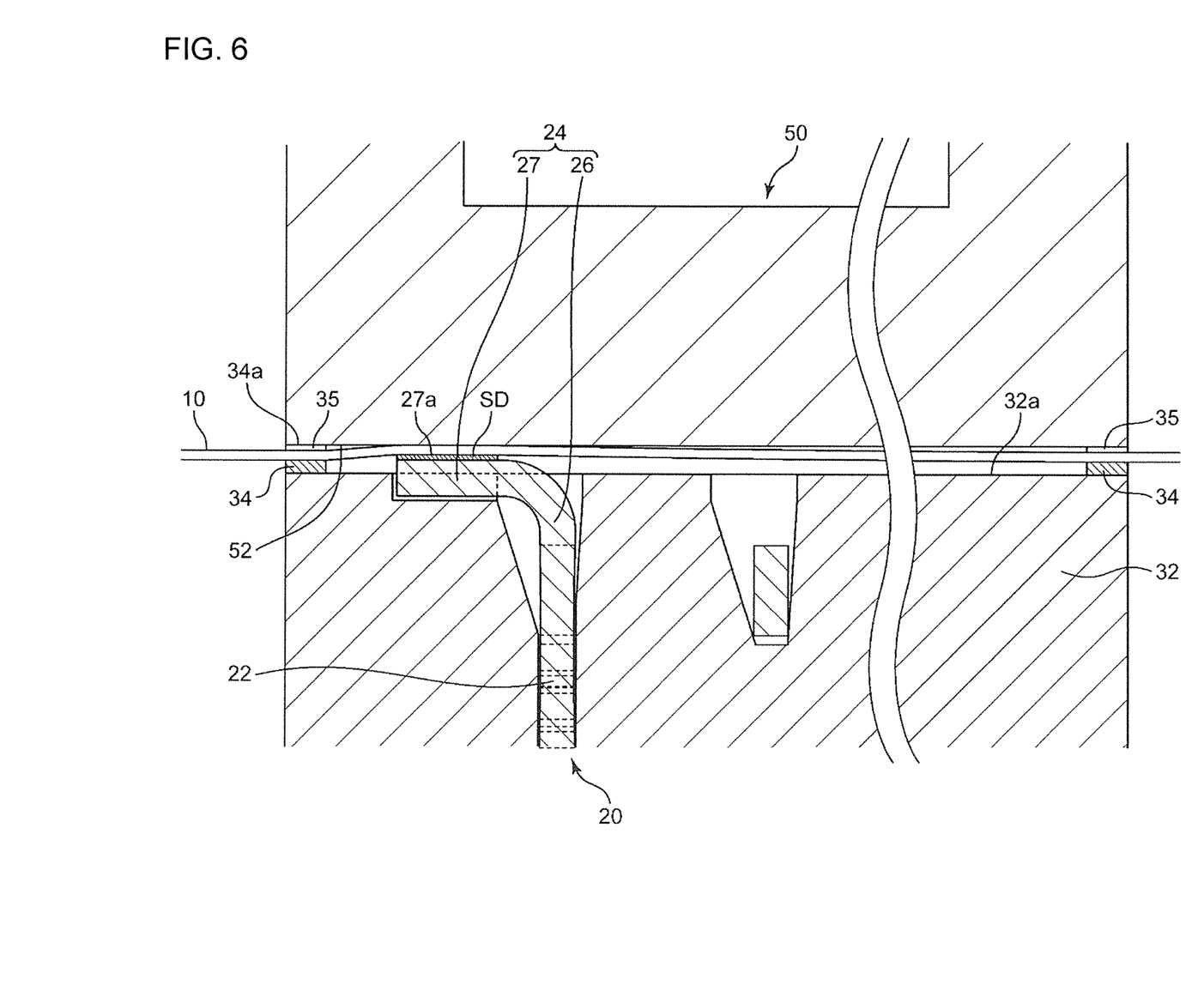
FIG. 6 is an enlarged view of a part enclosed by a frame line VI in FIG. 5.

The wire connecting portion 24 of each terminal 20 integrally includes a first projecting portion 26 and a second projecting portion 27, as shown in FIG. 6. The first projecting portion 26 projects in the first direction (up in FIG. 6) from the held portion 22. The second projecting portion 27 extends from the first projecting portion 26 in a second direction (laterally in FIG. 6) parallel to the surface of the terminal holding portion 32 and perpendicular to the array direction.

The second projecting portion 27 has a conductor connection surface 27a on an outer side surface (upper surface in FIGS. 5 and 6), which is opposite to the upper surface 32a of the terminal holding portion 32. The conductor connection surface 27a is connectable by soldering to a part to be connected, which is a specific part of the conductor 12 of the wire 10 with the part to be connected placed thereon. The conductor connection surface 27a according to this embodiment extends parallel to the upper surface 32a of the terminal holding portion 32 while being exposed at a position above the upper surface 32a of the terminal holding portion 32.

In the first embodiment, heights of the respective conductor connection surfaces 27a from the upper surface 32a of the terminal holding portion 32 are equal. That is, the terminal holding portion 32 holds the respective terminals 20 such that the conductor connection surfaces 27a of the terminals 20 are arranged on the same plane above the upper surface 32a of the terminal holding portion 32.

Further, the terminal holding portion 32 of the first embodiment holds the held portions 22 of the terminals 20 with the conductor connection surfaces 27a of the terminals 20 arranged at intervals in the array direction and with the conductor connection surfaces 27a of the terminals 20 that are adjacent in the array direction shifted from each other in the longitudinal direction of the wires 10.

The insulating housing 30 of this embodiment further includes two fixing portions 34 in addition to a housing body constituted by the terminal holding portion 32 and the receptacle 33. The fixing portions 34 are connected to the housing body to project from the upper surface 32a of the terminal holding portion 32 such that the fixing portions 34 can contact the wires 10 at fixing positions separated in the longitudinal direction of the wires 10 from the parts to be connected.

Specifically, the fixing portions 34 are connected to the upper surface 32a to project farther up than the upper surface 32a of the terminal holding portion 32 at positions on both sides of an area where the respective terminals 20 are disposed in a direction parallel to the longitudinal direction of the wires 10. Each fixing portion 34 of this embodiment is a rectangular column extending in the array direction and the upper surface thereof constitutes a heated surface 34a to be heated, as described later.

The fixing portions 34 are molded of synthetic resin having a melting point lower than a material (generally, synthetic resin) constituting the housing body. Specifically, the material constituting the fixing portions 34 is preferably thermoplastic resin having a melting point lower than a melting temperature (e.g. 380° C. to 400° C.) of solder and moldable into a fine shape. For example, PBT (polybutylene terephthalate) resin, PPS (polyphenylene sulfide) resin, PA6 (6 nylon) resin and the like are preferable. On the other hand, the material constituting the housing body preferably has a melting point higher than the melting temperature of the solder and is excellent formability and heat resistance. For example, LCP (liquid crystal polymer) and glass-containing resin are preferable. The fixing portions 34 and the housing body also can be moded integrally, for example, by two-color molding.

The fixing portion 34 according to this embodiment includes recesses 35 arranged in the array direction. As shown in FIGS. 4 and 6, each recess 35 is recessed down from the heated surface 34a. Each recess 35 according to this embodiment is a groove having a constant width and extending in the longitudinal direction of the wire 10, and each of the wires 10 can be fit into the recess 35 to determine a position of the wire 10 with respect to the fixing portion 34 in the array direction.

Each recess 35 has a depth such that the outer peripheral surface of the wire fit into the recess 35 is sunk down from the heated surface 34a. Specifically, each recess 35 according to this embodiment has a depth larger than a diameter of each wire 10.

A method for manufacturing the electrical connection assembly includes the following steps.

Wire Preparing Step and Connector Preparing Step

The wires 10 and the connector CN described above are prepared in advance. Further, the wires 10 include the insulation coatings 14 made of specific synthetic resin. The specific synthetic resin has an insulating property at normal temperature and, on the other hand, is meltable or dissolvable at a melting temperature (e.g. 380 to 400°) of solder used in a connecting step to be described later. Polyurethane, polyester, nylon and the like are preferable as the specific synthetic resin.

A thickness of the insulation coating 14 is set such that the insulation coating 14 can be removed and the conductor 12 can be exposed by heating while an insulating state is ensured at normal temperature. A dimension, for example, approximate to a thickness of an insulation coating in an ordinary enamel wire can be adopted as the thickness.

Solder Setting Step

Solder SD, as shown in FIG. 6, is set in advance on the conductor connection surface 27a of each of the plurality of terminals 20 in the connector CN. This setting may be performed by placing the solder SD in a solid state on each conductor connection surface 27a or applying the solder SD in a paste state to each conductor connection surface 27a.

Connecting Step and Fixing Step

Figure 2:
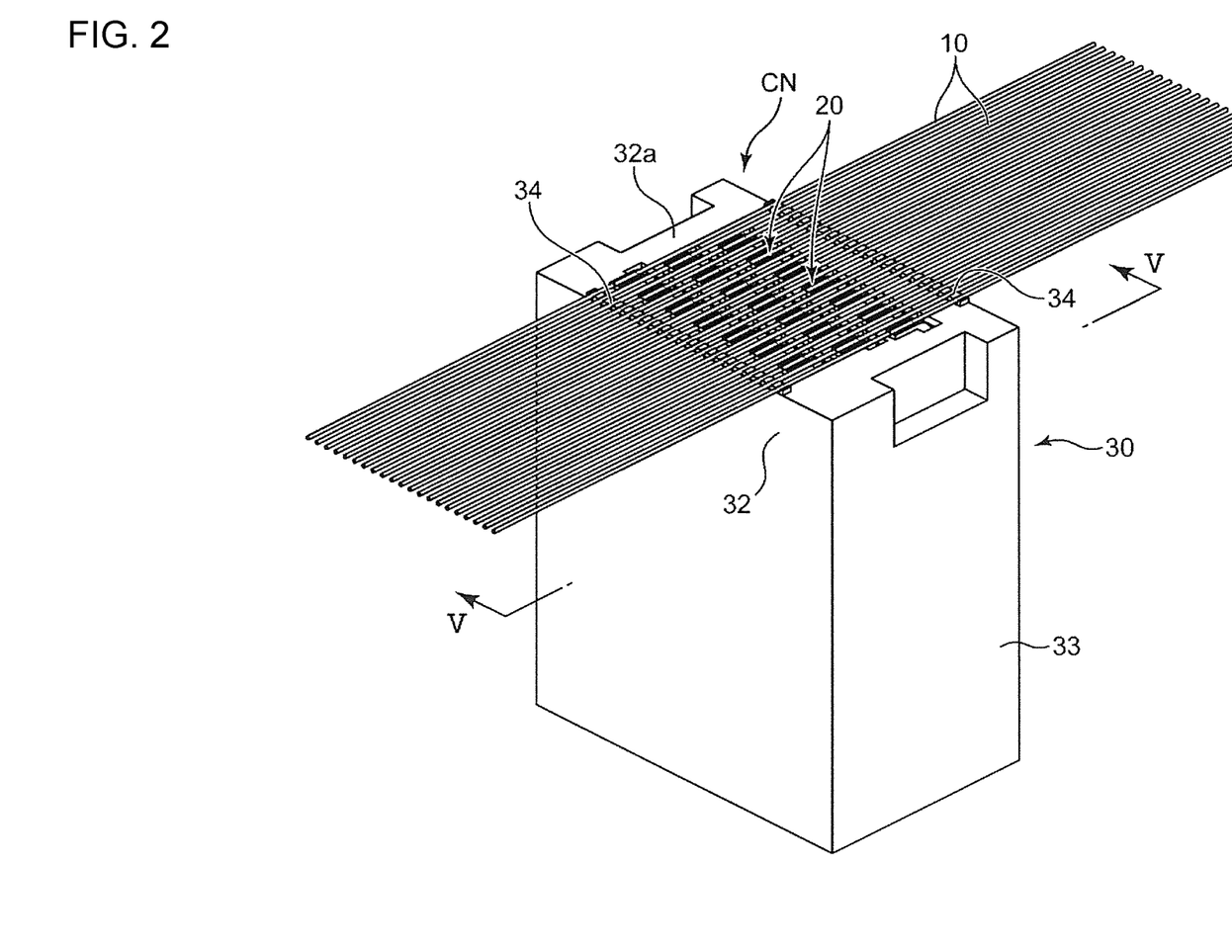
FIG. 2 is a perspective view showing a state where a plurality of wires are set on the connector.
Figure 3:
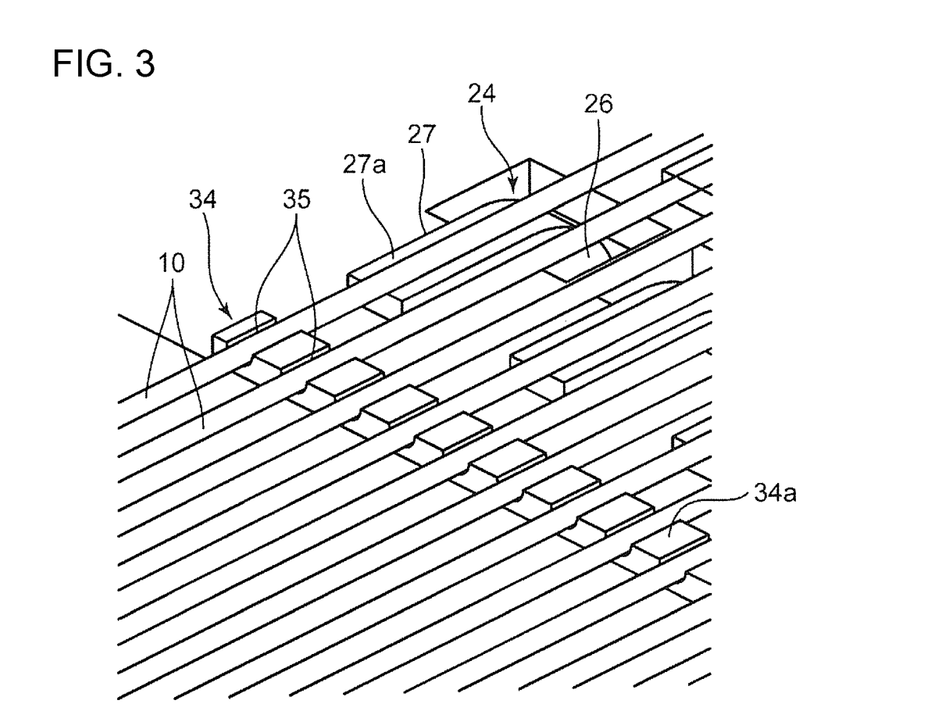
FIG. 3 is a perspective view showing an essential part of the electrical connection assembly in the state shown in FIG. 2.

The parts to be connected set in longitudinally intermediate areas of the wires 10 are pressed toward the respective conductor connection surfaces 27a of the terminals 20 with the parts to be connected kept covered by the insulation coatings 14. The insulation coatings 14 then are heated together with the solder SD while the wires 10 are held in a state arrayed at intervals from each other in the array direction, as shown in FIG. 2. Thus, the insulation coatings 14 covering the parts to be connected are removed from the surfaces of the conductors 12 by melting or dissolving, and the solder SD electrically connects the conductors 12 exposed by removing the insulation coatings 14 and the conductor connection surfaces 27a.

Further, in this embodiment, each fixing portion 34 is melted utilizing heat for melting the solder SD simultaneously with the connecting step, thereby performing a fixing step of fixing each wire 10 to the insulating housing 30 at each fixing position. The fixing step is described in detail below.

The wires 10 are held by holding parts of the wires 10 at positions on both outer sides across the parts to be connected, more preferably at positions outward of both ends of the connector CN in a front-rear direction (direction parallel to the second direction and the wire longitudinal direction). Thus, the wires 10 are set on the corresponding conductor connection surfaces 27a while suitable tension is applied to each of the wires 10. The wires 10 can be held, for example, by bobbins on which the wires 10 are to be wound, clamping tools for clamping the respective wires 10 from both sides in a direction perpendicular to the longitudinal direction and the array direction of the wires 10 or the like.

On the other hand, each fixing portion 34 projects farther up than the upper surface 32a of the terminal holding portion 32 in the insulating housing 30. Thus, each wire 10 is in contact with each fixing portion 34 in setting each wire 10. Particularly, since each fixing portion 34 is formed with the recesses 35 corresponding to the respective wires 10 in this embodiment, relative positions of the wires 10 with respect to each fixing portion 34 are determined by the respective wires 10 being fit into the respective recesses 35 at the fixing positions (positions set at both outer sides of the area where the terminals 20 are disposed in this embodiment). This improves product quality by stabilizing the relative positions of the wires 10 with respect to the insulating housing 30.

Figure 5:
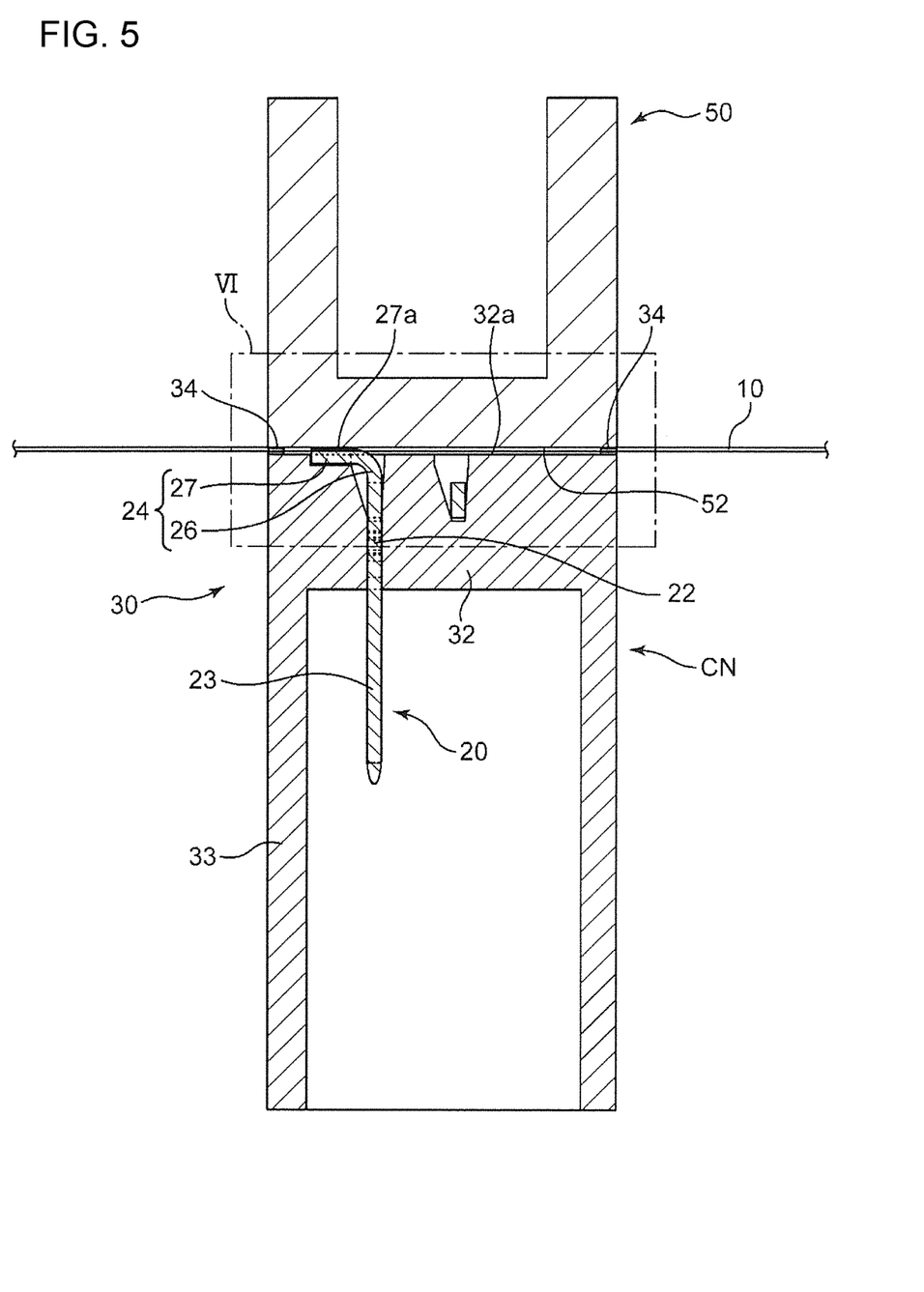
FIG. 5 is a side view in section along V-V of FIG. 2.

The wires 10 can be pressed efficiently against the conductor connection surfaces 27a and heated, using a heater 50, as shown in FIGS. 5 and 6. This heater 50 has a flat lower surface constituting a heating surface 52. The heating surface 52 is pressed against the wires 10 set on the respective conductor connection surfaces 27a via the solder SD from above. That is, the heating surface 52 is pressed toward the conductor connection surfaces 27a with the wires 10 respectively corresponding to the conductor connection surfaces 27a and the solder SD sandwiched between the heating surface 52 and the respective conductor connection surfaces 27a. In this way, the pressing of the wires 10 toward the conductor connection surfaces 27a, the melting of the solder SD by heating using the heater 52 and the melting or dissolving of the insulation coatings 14 in the parts to be connected by heating the insulation coatings 14 are performed simultaneously. The melting or dissolving of the insulation coatings 14 enables the insulation coatings 14 to be removed from the surfaces of the conductors 12.

In the first embodiment, the terminal holding portion 32 of the insulating housing 30 holds the terminals 20 such that the conductor connection surfaces 27a are on the same plane, i.e. the terminals 20 constitute a planar array. Thus, the single planar heating surface 52 simultaneously connects the parts of the conductors 12 of the wires 10 to the conductor connection surfaces 27a of the respective terminals 20 that are arrayed in the plane.

Further, the heating surface 52 of the heater 50 has an area capable of contacting the heated surface 34a of each fixing portion 34 at the same time as contacting each wire 10, thereby enabling the fixing portions 34 to be melted by heating, utilizing the heated surface 52. The fixing portions 34 thus melted adhere to the outer peripheral surface of the wires 10 and are solidified by cooling (natural cooling or forced cooling), thereby firmly holding the wires 10. In this way, the wires 10 are held on the insulating housing 30 at the positions on the outer sides of the parts to be connected. More particularly, the wires 10 are held on the terminal holding portion 32 via the fixing portions 34 of the insulating housing 30. This holding of the wires 10 effectively suppresses the action of tension generated in each wire 10 on connected parts of the parts to be connected and the conductor connection surfaces 27a, thereby enabling the connected parts to be protected by a simple structure.

In addition, the material constituting the housing body of the insulating housing 30 has the higher melting point than the fixing portions 34 (preferably higher melting point than the melting temperature of the solder). Thus, the housing body is not likely to deform due to the heating.

For this fixing step, a height (i.e. vertical distance from the upper surface 32a of the terminal holding portion 32) of the heated surfaces 34a is set such that the heated surfaces 34a of the fixing portions 34 and the upper surfaces of the wires 10 set on the conductor connection surfaces 27a via the solder SD are arranged substantially on the same plane, as shown in FIG. 6. This setting enables the heating surface 52, which is the lower surface of the heater 50, to contact the wires 10 and the heated surfaces 34a of the fixing portions 34 substantially simultaneously. Further, the depth of the recesses 35 is preferably set such that the wires 10 are sunk from the heated surfaces 34a, thereby suppressing sudden contact of the parts of the wires 10 fit into the recesses 35 with the heating surface 52 to melt or dissolve the insulation coatings 14 in these parts.

Cutting Step

After the connecting step is completed as described above, the wires 10 are cut at a suitable position in their longitudinal direction. The wires 10 can be cut efficiently, for example, by sandwiching and shearing the wires 10 in a cutting direction perpendicular to the longitudinal direction and the array direction of the wires 10 by a pair of cutting tools. This cutting step may be omitted.

The invention is not limited to the embodiment described above and may include the following modes.

A) Concerning Wiring Material

The wiring material used in the invention is not limited to the one in which the conductors 12 are covered individually by the insulation coatings 14 to configure the wires 10, as described above. The wiring material may have an insulation coating covering respective conductors adjacent to each other in the array direction as an integrally connected insulation coating, e.g. a flat cable or a ribbon cable. Alternatively, a wiring material may be constituted by a plurality of bare wires with no insulation coating.

B) Concerning Terminal

The shape of the terminal according to the invention is not limited. The terminal may have the conductor connection surface exposed outside the insulating housing and may be able to have the part to be connected of the conductor connected to the conductor connection surface. For example, the first projecting portion 26 of the wire connecting portion 24 may project a large amount and the entire second projecting portion 27 may be separated outward from the upper surface 32a of the terminal holding portion 32. Alternatively, if a cross-sectional area (area of a cross-section perpendicular to an axial direction) of the terminal is relatively large, an end surface of this terminal may be used as a conductor connection surface.

C) Connecting Step

The removal of the insulation coatings 14 from the surfaces of the conductors 12 by melting or dissolving is performed simultaneously with the melting of the solder by heating using the heater in the above-described embodiment. However, the insulation coatings 14 may be removed before heating. Specifically, the insulation coatings may be removed in advance before the connecting step by a so-called stripping process to expose the conductors in the parts to be connected set in the plurality of respective wires, and the conductors exposed as described above and the conductor connection surfaces may be directly soldered in the connecting step. In this case, the material constituting the insulation coatings may not necessarily be meltable or dissolvable at the melting temperature of the solder. Further, it goes without saying that the removal of the insulation coatings is not necessary if the wiring material is constituted by a plurality of bare wires.

Further, a specific means for the connection is not limited to soldering. This connection may be made by another connecting means by heating such as welding (laser welding, ultrasonic welding, resistance welding or the like).

D) Concerning Fixing Step

The melting of the insulating housing in the fixing step may not necessarily be performed simultaneously with the connecting step. After the connecting step is completed, e.g. after the solder is solidified, the fixing step may be performed by heating the fixing portions. Conversely, the connecting step may be performed after the fixing of the wiring material to the insulating housing is completed by the fixing step. Further, a means for heating the fixing portions in the fixing step does not matter. Beside heat transfer from the heater 50 as described above, the heating may be performed, for example, by a heating means for heat radiation or welding.

(E) Concerning Connector

Figure 1:
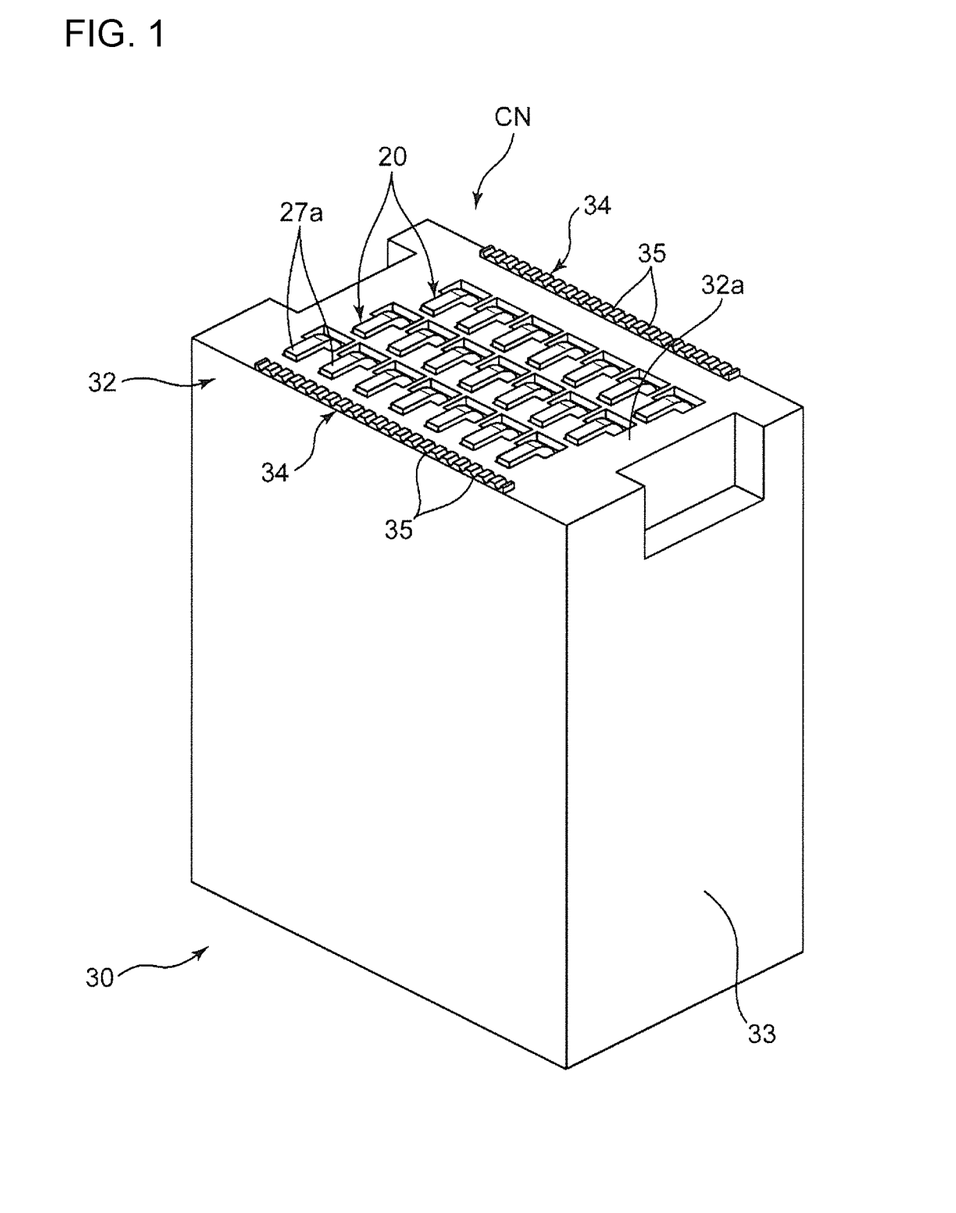
FIG. 1 is a perspective view of a connector constituting an electrical connection assembly according to one embodiment of the present invention.

The fixing portion in the connector may be arranged only on one side of the parts to be connected of the conductors in the longitudinal direction of the conductors. In other words, in the case of the connector CN as shown in FIG. 1, one of the fixing portions 34 included in this connector CN may be omitted. For example, if the part to be connected of each conductor 12 is set near one end of this conductor 12 and there is no possibility that tension acts on the one end of the wiring material, the fixing portion on the side corresponding to this one end can be omitted as appropriate. Alternatively, the fixing step may be performed only for some wires having a high possibility of tension acting thereon.

Further, the specific shape of the housing body is not particularly limited. For example, if terminals included in a connector are female terminals, the receptacle 33 shown in FIG. 1 and the like is not always necessary.

As described above, a method is provided for manufacturing an electrical connection assembly with a wiring material including conductors and a connector. The method enables connected parts of the conductors and terminals included in the connector to be protected by a simple configuration. A connector suitable for the method also is provided.

A method is provided for manufacturing an electrical connection assembly with a wiring material including conductors and a connector including terminals respectively corresponding to the conductors and an insulating housing for collectively holding the terminals. The conductors are connected conductively to the terminals while being arranged at intervals in an array direction perpendicular to a longitudinal direction of the conductors. This method includes a connector preparing step of preparing a connector, in which each of the terminals has a conductor connection surface exposed outside the insulating housing from a surface of the insulating housing and the insulating housing holds the terminals such that the conductor connection surfaces are arranged in the array direction at the same intervals as those of the conductors in the array direction. The method also includes a connecting step of electrically connecting parts to be connected set in the respective conductors and the conductor connection surfaces corresponding thereto while the conductors are held in a state arrayed at intervals from each other in the array direction. The method further includes a fixing step of fixing the wiring material to the insulating housing by bringing the wiring material and the insulating housing into contact with each other at a fixing position of the wiring material separated in a longitudinal direction of the wiring material from the parts to be connected and solidifying the insulating housing after melting the insulating housing at the fixing position.

According to this method, the conductors and the conductor connection surfaces of the terminals corresponding thereto are connected. In addition, the wiring material is fixed to the insulating housing at the fixing position separated in the longitudinal direction of the conductors from the parts to be connected of the conductors, thereby suppressing the transfer of tension acting on the wiring material to connected parts outside the insulating housing and effectively protecting the connected parts. In addition, the wiring material is fixed to the insulating housing by bringing the wiring material and the insulating housing into contact with each other at the fixing position and solidifying the insulating housing after melting the insulating housing at the fixing position. Thus, the connected parts can be protected by a simple configuration utilizing the insulating housing without adding a large-scale facility to the connector.

Further, the melting of the insulating housing in the fixing step can also be performed, utilizing heat for connecting the conductors and the conductor connection surfaces. For example, the melting can be performed simultaneously with soldering, using a heater for soldering for the connection. That is, the connecting step and the fixing step can be performed simultaneously, using a common heater. This drastically improves the manufacturing efficiency of the electrical connection assembly.

A connector in which the insulating housing includes a housing body having a part for holding the terminals and a fixing portion made of synthetic resin having a lower melting point than a material constituting the housing body. The fixing portion may be connected to the housing body to project from the surface of the housing body to be able to contact the wiring material at the fixing portion. The wiring material can be fixed to the fixing portion in the fixing step by solidifying the fixing portion after melting the fixing portion while the wiring material and the fixing portion are held in contact with each other at the fixing position. In addition, the material constituting the housing body of the insulating housing has a higher melting point than the fixing portion. Thus, the deformation of the housing body due to the heating of the fixing portion can be avoided.

The connector also relates to a connector suitable for the above method. This connector constitutes an electrical connection assembly by being connected to a wiring material including plural conductors, and includes terminals respectively corresponding to the conductors and an insulating housing for collectively holding the terminals in such an array that the conductors are respectively conductively connectable to the terminals while being arranged in an array direction perpendicular to a longitudinal direction of the conductors. Each of the terminals has a conductor connection surface exposed outside the insulating housing from a surface of the insulating housing and connectable to a part to be connected set in each conductor. The insulating housing includes a housing body having a part for holding the terminals and a fixing portion made of synthetic resin having a lower melting point than a material constituting the housing body. The fixing portion is connected to the housing body to project from a surface of the housing body to be able to contact the wiring material at a fixing position separated in a longitudinal direction of the wiring material from the parts to be connected.

The fixing portion of the connector preferably has a recess. The wiring material can fit into the recess at the fixing portion, and is shaped to determine a relative position of the wiring material with respect to the fixing portion by fitting the wiring material into the recess. The recess of the fixing portion stabilizes the relative position of the wiring material with respect to the fixing portion, i.e. the fixing position where the wiring material is fixed to the insulating housing, thereby improving quality improvement of the electrical connection assembly.

The recess preferably has such a depth as to cause a surface of the wiring material to sink from a surface of the fixing portion with the wiring material fit in the recess. This makes it easy for a heater for heating the fixing portion to contact the surface of the fixing portion without contacting the wiring material fit in the recess.

Further, according to the present invention, an electrical connection assembly with a wiring material including conductors and the connector is provided in which the parts to be connected of the conductors are connected to the conductor connection surfaces of the terminals in the connector with the conductors arranged in an array direction perpendicular to a longitudinal direction of the conductors and the wiring material is fixed to the fixing portion at a fixing position separated in a longitudinal direction of the wiring material from the parts to be connected. According to this electrical connection assembly, connected parts of the conductors of the wiring material and the conductor connection surfaces of the terminals are protected by a simple configuration using only the fixing portion, which is a part of the insulating housing.

The invention claimed is:

1. A method for manufacturing an electrical connection assembly with a wiring material including conductors and a connector including terminals respectively corresponding to the conductors and an insulating housing for collectively holding the terminals, the conductors being respectively conductively connected to the terminals while being arranged at intervals in an array direction perpendicular to a longitudinal direction of the conductors, comprising:
  a connector preparing step of preparing a connector by positioning each of the terminals relative to the insulating housing so that a conductor connection surface of each of the terminals is exposed outside the insulating housing from a surface of the insulating housing and so that the insulating housing holds the terminals such that the conductor connection surfaces thereof are arranged in the array direction at the same intervals as the intervals of the conductors in the array direction;
  a wiring material holding step of holding the wiring material on the insulating housing at fixing positions spaced from the conductor connection surface of the respective terminal in opposite directions parallel to the longitudinal direction of the conductors and so that the conductors are at the intervals in the array direction;
  a connecting step of electrically connecting parts of the respective conductors and the conductor connection surfaces corresponding thereto while the conductors are held at the fixing positions in a state arrayed at intervals from each other in the array direction;
  a melting step of melting the insulating housing at the fixing positions so that the insulating housing engages the wiring material at the fixing positions; and
  a fixing step of allowing melted parts of the insulating housing to solidify into engagement with the wiring material after melting the insulating housing at the fixing position.

2. The method for manufacturing an electrical connection assembly of claim 1, wherein the melting of the insulating housing in the melting step is performed, utilizing heat for connecting the conductors and the conductor connection surfaces.

3. The method for manufacturing an electrical connection assembly of claim 2, wherein the melting of the insulating housing in the melting step is performed simultaneously with soldering, using a heater for the soldering.

4. The method for manufacturing an electrical connection assembly of claim 1, wherein the insulating housing includes a housing body having a part for holding the terminals and a fixing portion made of synthetic resin having a lower melting point than a material constituting the housing body and the fixing portion is connected to the housing body at the fixing position to project from the surface of the housing body to be able to contact the wiring material at the fixing position, and the wiring material is fixed to the fixing portion by melting the fixing portion during the melting step and allowing the melted fixing portion to solidify while the wiring material and fixing portion are held in contact with each other at the fixing position in the fixing step.

5. A connector constituting an electrical connection assembly by being connected to a wiring material that includes conductors, comprising:
   terminals respectively corresponding to the conductors; and
   an insulating housing for collectively holding the terminals in an array where the conductors are respectively conductively connectable to the terminals while being arranged in an array direction perpendicular to a longitudinal direction of the conductors;
   each of the terminals having a conductor connection surface exposed outside the insulating housing from a surface of the insulating housing and connectable to a part to be connected in each conductor; and
   the insulating housing including a housing body having a part for holding the terminals and a fixing portion made of synthetic resin having a lower melting point than a material constituting the housing body, the fixing portion being connected to the housing body to project from a surface of the housing body to be able to contact the wiring material at a fixing position separated in a longitudinal direction of the wiring material from the terminals and the parts to be connected in each of the conductors.

6. The connector of claim 5, wherein the fixing portion has a recess, the wiring material being fittable into the recess at the fixing portion, and the recess being shaped to determine a relative position of the wiring material with respect to the fixing portion by the fitting of the wiring material into the recess.

7. The connector of claim 6, wherein the recess has such a depth as to cause a surface of the wiring material to sink from a surface of the fixing portion with the wiring material fit in the recess.

8. An electrical connection assembly, comprising:
   a wiring material including conductors; and
   the connector of claim 5;
   parts to be connected of the conductors being respectively connected to the conductor connection surfaces of the terminals in the connector with the conductors arranged in an array direction perpendicular to a longitudinal direction of the conductors, and the wiring material being fixed to the fixing portion at a fixing position separated in the longitudinal direction of the wiring material from the parts to be connected.

* * * * *